United States Patent
Kuo

(10) Patent No.: US 10,447,140 B1
(45) Date of Patent: Oct. 15, 2019

(54) VOLTAGE BAND-PASS ENABLE CIRCUIT

(71) Applicant: Quanta Computer Inc., Taoyuan (TW)

(72) Inventor: Hsin-Chih Kuo, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/105,198

(22) Filed: Aug. 20, 2018

(30) Foreign Application Priority Data

May 3, 2018 (TW) .............................. 107115038 A

(51) Int. Cl.
*H03K 17/00* (2006.01)
*H02M 1/08* (2006.01)
*H03K 17/687* (2006.01)
*H02M 3/04* (2006.01)

(52) U.S. Cl.
CPC ............ *H02M 1/08* (2013.01); *H03K 17/687* (2013.01); *H02M 3/04* (2013.01); *H03K 2217/0027* (2013.01)

(58) Field of Classification Search
CPC ........ H02M 1/08; H02M 3/04; H03K 17/687; H03K 2217/0027
USPC ................................................. 327/109, 142
See application file for complete search history.

(56) References Cited

U.S. PATENT DOCUMENTS

| 8,836,386 | B1* | 9/2014 | Hwang | ..................... G06F 1/24 327/142 |
| 2005/0189970 | A1* | 9/2005 | Nakatake | .................. H03L 7/08 327/143 |
| 2011/0095814 | A1* | 4/2011 | Kim | ......................... G11C 5/14 327/538 |

* cited by examiner

*Primary Examiner* — Ryan Jager
(74) *Attorney, Agent, or Firm* — McClure, Qualey & Rodack, LLP

(57) ABSTRACT

An enable circuit includes a first detection controller, a second detection controller, and an enable switch. The first detection controller has a first input terminal coupled to a first input terminal voltage and a first output terminal. The second detection controller has a second input terminal coupled to the first input terminal voltage and a second output terminal. The enable switch has a control terminal coupled to the second output terminal, a third input terminal coupled to a second input terminal voltage, and a third output terminal. When the first input terminal voltage is higher than the first setting voltage but lower than the second setting voltage, the enable circuit is coupled to ground by the second output terminal, thus the enable switch is turned on to output an enable signal from the third output terminal, wherein the enable signal is provided by a second input terminal voltage.

4 Claims, 6 Drawing Sheets

VOLTAGE BAND-PASS ENABLE CIRCUIT

CROSS REFERENCE TO RELATED APPLICATIONS

This application claims priority to and the benefit of Taiwan Application No. 107115038, filed May 3, 2018.

FIELD OF THE INVENTION

The invention relates to an enable circuit, especially relating to a voltage band-pass enable circuit. When the enable circuit detects an input voltage that falls into a specific range of voltage, the enable circuit can output an enable signal to the circuit or device to be enabled.

DESCRIPTION OF THE RELATED ART

Electronic devices (or components) on the market all have power input pins and enable pins, and most of these electronic devices cannot be enabled until they receive stable power or power that approaches a specific voltage level. Unstable power or power that doesn't approach a specific voltage level may lead to abnormal actions on the part of the electronic devices, or even damage the electronic devices.

Some specific power conversion circuits are applied. For example, a boost converter in a system can boost an input voltage ranging from 5V to 20V to an output voltage ranging from 5V to 12V. However, the input voltage is always lower than the output voltage for the boost converter. In other words, when the input voltage of the boost converter is higher than 12V, the boost converter of the system can be disabled first, and the input voltage of the boost converter can be directly applied to a load (an electronic device or another system) connected to the system, thereby improving power conversion efficiency and the power stability of the system.

BRIEF SUMMARY OF THE INVENTION

In order to resolve the issue described above, the invention provides an enable circuit that enables a post circuit only when an input voltage is higher than an enable threshold voltage and disables the post circuit only when the input voltage is higher than a disable threshold voltage. A first setting voltage (enable threshold voltage) and a second setting voltage (disable threshold voltage) that are both adjustable are provided in the invention to send out an enable or disable signal to the post circuit.

In more detail, an embodiment of the invention provides an enable circuit that comprises a first detection controller, a second detection controller, and an enable switch. The first detection controller has a first input terminal coupled to a first input terminal voltage and a first output terminal, wherein when the first input terminal voltage is not higher than the first setting voltage, the first detection controller connects the first output terminal to a ground; when the first input terminal voltage is higher than the first setting voltage, the first detection controller disconnects the first output terminal from the ground. The second detection controller has a second input terminal coupled to the first input terminal voltage and a second output terminal, wherein the second input terminal is further coupled to the first output terminal, and when the first input terminal voltage is not higher than the second setting voltage, the second detection controller connects the second output terminal to the ground; when the first input terminal voltage is higher than the second setting voltage, the second detection controller disconnects the second output terminal from the ground. The second setting voltage is higher than the first setting voltage. The enable switch has a control terminal coupled to the second output terminal, a third input terminal coupled to a second input terminal voltage, and a third output terminal, wherein when the first input terminal voltage is higher than the first setting voltage but lower than the second setting voltage, the enable circuit is coupled to the ground by the second output terminal, so that the enable switch is turned on to output an enable signal from the third output terminal, wherein the enable signal is provided by the second input terminal voltage.

According to the enable circuit disclosed above, the first input terminal voltage is provided by a first input terminal power. After the first input terminal power starts up, when the first input terminal voltage is increased from the first setting voltage to the second setting voltage, the enable circuit outputs the enable signal.

According to the enable circuit disclosed above, further comprising one or more voltage clamping devices coupled to the first input terminal of the first detection controller, the second input terminal of the second detection controller, or between the third input terminal of the enable switch and the ground, to clamp the first input terminal voltage or the second input terminal voltage under the rating voltage of the first detection controller or the second detection controller.

An embodiment of the invention provides a power switching system, comprising the enable circuit disclosed in claim 1, a two-way switch, and a DC-DC boost converter. The enable circuit disclosed in claim 1 receives the first input terminal voltage, and when the first input terminal voltage is higher than the first setting voltage but lower than the second setting voltage, the enable circuit outputs the enable signal from the third output terminal. The two-way switch has an input, an output control terminal, a fourth output terminal, and a fifth output terminal. The input receives the first input terminal voltage, and the output control terminal couples to the third output terminal of the enable circuit. The two-way switch connects the input to the fourth output terminal when receiving the enable signal, but otherwise connects the input to the fifth output terminal. The DC-DC boost converter couples to the fourth output terminal of the two-way switch, and boosts the first input terminal voltage from the fourth input terminal when receiving the enable signal.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Figure 1:
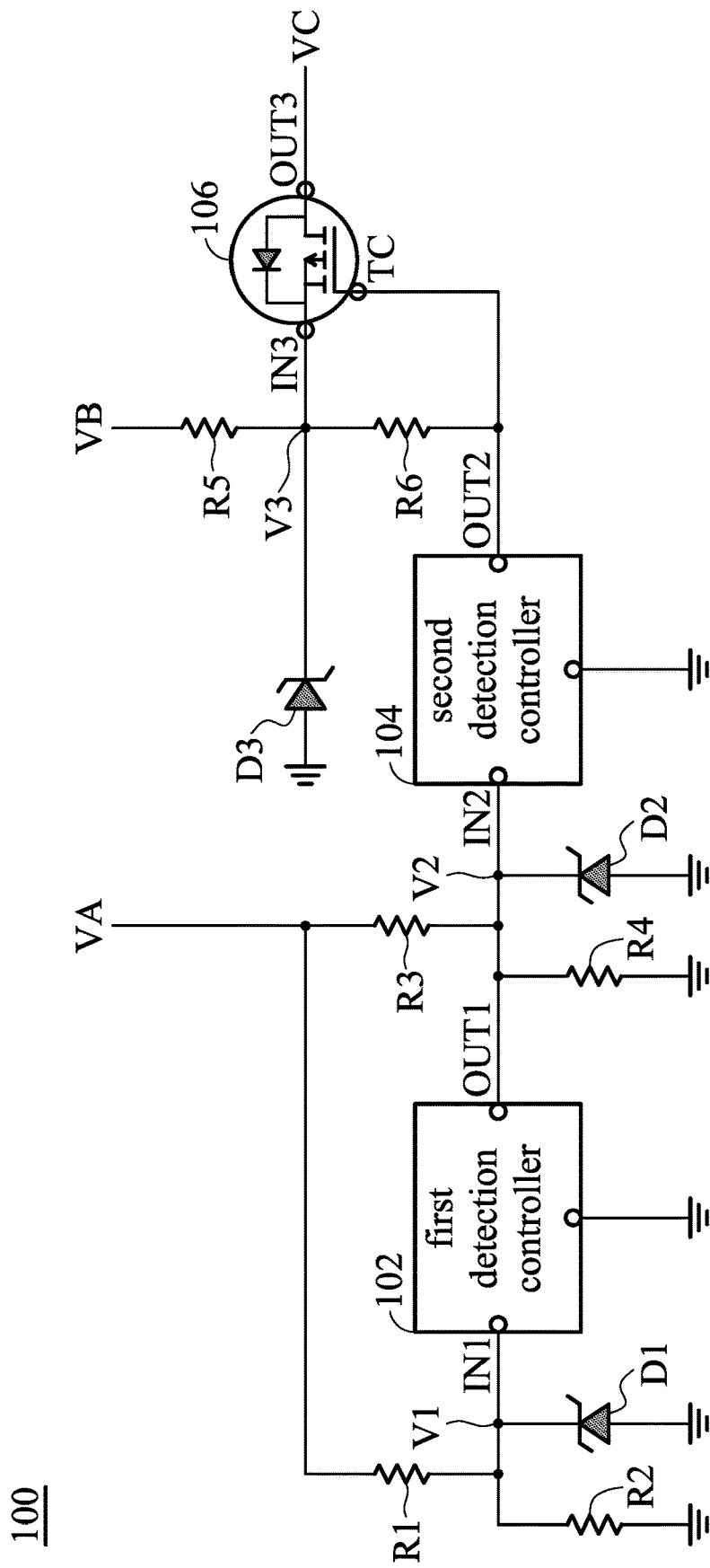
FIG. 1 shows a schematic of an enable circuit in accordance with an embodiment of the disclosure.

FIG. 1 shows a schematic of an enable circuit in accordance with an embodiment of the disclosure. As shown in FIG. 1, the enable circuit 100 comprises a first detection controller 102, a second detection controller 104, an enable switch 106, a plurality of voltage divided resistors (R1-R6), and one or more optional voltage clamping devices. For example, 3 Zener diodes are applied as the voltage clamping devices here. The first detection controller 102 has a first input terminal IN1 coupled to a first input terminal voltage (VA) and a first output terminal OUT1; the second detection controller 104 has a second input terminal IN2 coupled to the first input terminal voltage (VA) and a second output terminal OUT2, wherein the second input terminal IN2 further couples to the first output terminal OUT1. The enable switch 106 has a control terminal TC coupled to the second output terminal OUT2, a third input terminal IN3 coupled to a second input terminal voltage (VB), and a third output terminal OUT3.

The first detection controller 102 detects the first input terminal voltage (VA) via the voltage divided resistors R1 and R2. The first detection controller 102 configured to connect the first output terminal OUT1 to a ground when the first input terminal voltage (VA) is not higher than the first setting voltage (VL), and to disconnect the first output terminal OUT1 from the ground when the first input terminal voltage (VA) is higher than the first setting voltage (VL). The second detection controller 104 detects the second input terminal voltage (VA) via the voltage divided resistors R3 and R4. The second detection controller 104 connects the second output terminal OUT2 to the ground when the first input terminal voltage (VA) is not higher than the second setting voltage (VH), and to disconnect the second output terminal OUT2 from the ground when the first input terminal voltage (VA) is higher than the second setting voltage (VH). It should be noted that the second setting voltage (VH) is higher than the first setting voltage (VL). The second output terminal OUT2 of the enable circuit 100 is connected to the ground, second input terminal, third output terminal when the first input terminal voltage (VA) is higher than the first setting voltage (VL) but lower than the second setting voltage (VH), and thereby the enable switch 106 is turned on to output an enable signal powered by the second input terminal voltage (VB) to the third output terminal OUT3.

Figure 2A:
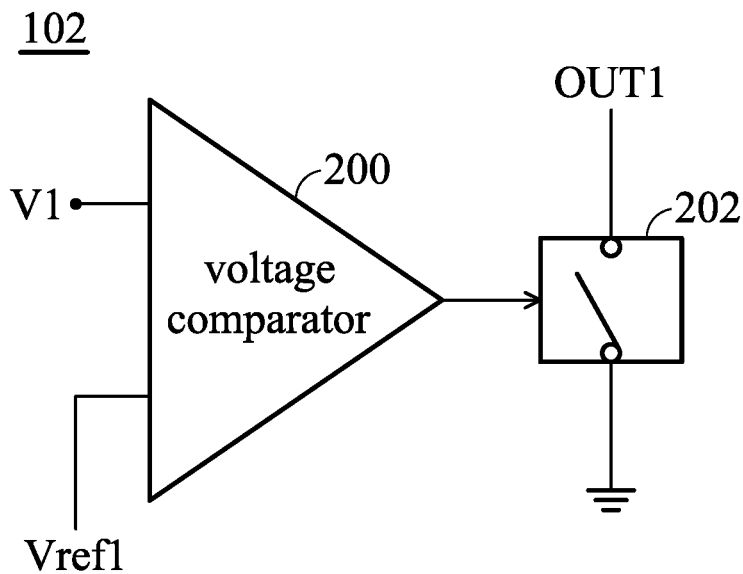
FIG. 2A shows a schematic of the internal structure of the first detection controller in FIG. 1 in accordance with the embodiment of the disclosure.

FIG. 2A shows a schematic of the internal structure of a first detection controller in FIG. 1 in accordance with the embodiment of the disclosure. In more detail, the internal structure of the first detection controller 102, as shown in FIG. 2A, comprises a voltage comparator 200, and a first switch 202. The voltage comparator 200 in the first detection controller 102 receives a voltage V1 which is divided by the voltage divided resistors R1 and R2 from the first input terminal voltage (VA), and compares the voltage V1 with a first reference voltage (Vref1) which is proportional (the scale is R2/(R1+R2) hereto) to the first setting voltage (VL). When the voltage V1 is not higher than the first reference voltage (Vref1), it indicates that the first input terminal voltage (VA) is not higher than the first setting voltage (VL). Thus, the first switch 202 in the first detection controller 102 is turned on, so that the first detection controller 102 connects the first output terminal OUT1 to the ground. When the voltage V1 is higher than the first reference voltage (Vref1), it indicates that the first input terminal voltage (VA) is also higher than the first setting voltage (VL). Thus, the first switch 202 in the first detection controller 102 is turned off, so that the first detection controller 102 disconnects the first output terminal OUT1 from the ground. At this time, a voltage V2 at the first output terminal OUT1 is the voltage that is divided by the voltage divided resistors R3 and R4 from the first input terminal voltage (VA).

Figure 2B:
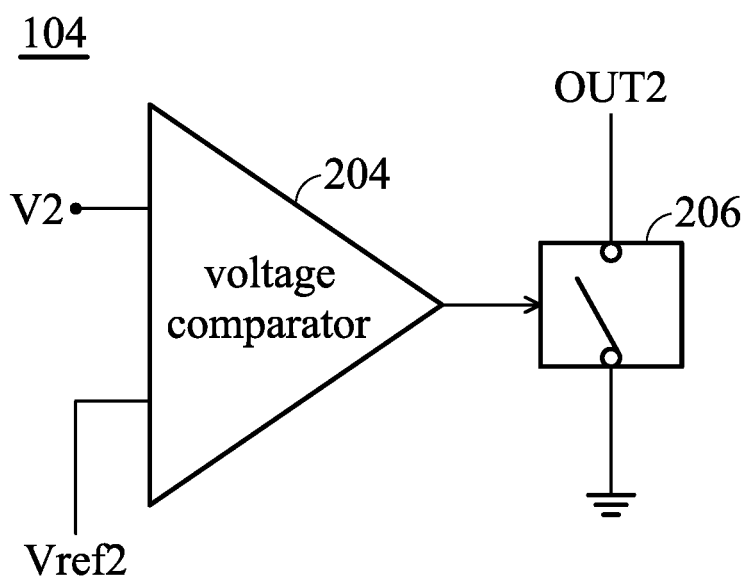
FIG. 2B shows a schematic of the internal structure of a second detection controller in FIG. 1 in accordance with the embodiment of the disclosure.

The second detection controller 104 has the same internal structure as the first detection controller 102. As shown in FIG. 2B, the voltage comparator 204 in the second detection controller 104 receives the voltage V2 which is divided by the voltage divided resistors R3 and R4 from the first input terminal voltage (VA), and compares the voltage V2 with a second reference voltage (Vref2) which is proportional (the scale is R4/(R3+R4) hereto) to the second setting voltage (VH). When the voltage V2 is not higher than the second reference voltage (Vref2), it indicates that the first input terminal voltage (VA) is not higher than the second setting voltage (VH). Thus, the second switch 206 in the second detection controller 104 is turned on, so that the second detection controller 104 connects the second output terminal OUT2 to the ground. When the voltage V2 is higher than the second reference voltage (Vref2), it indicates that the first input terminal voltage (VA) is also higher than the second setting voltage (VH). Thus, the second switch 206 in the second detection controller 104 is turned off, so that the second detection controller 104 disconnects the second output terminal OUT2 from the ground.

The enable switch 106 has a control terminal TC coupled to the second output terminal OUT2 of the second detection controller 104, a third input terminal IN3 coupled to a second input terminal voltage (VB), and a third output terminal OUT3. Here, for example, the enable switch 106 is a PMOS transistor with a gate as the control terminal TC, a source as the third input terminal IN3, and a drain as the third output terminal OUT3. When the first input terminal voltage (VA) is higher than the first setting voltage (VL) (that is, the voltage V1 is higher than the first reference voltage (Vref1)), the first detection controller 102 disconnects the first output terminal OUT1 from the ground, and thus the voltage V2 on the first output terminal OUT1 is the voltage that is divided by the voltage divided resistors R3 and R4 from the first input terminal voltage (VA). When the first input terminal voltage (VA) is not higher than the second setting voltage (VH) (that is, the voltage V2 is not higher than the second reference voltage (Vref2)), the second detection controller 104 connects the second output terminal OUT2 to the ground. At this time, due to the second output terminal OUT2 having a voltage of 0V (grounded), the voltage across resistor R6 can bias the gate and the source of the PMOS by negative voltage (−V3), so that the PMOS is turned on, and thus the third output terminal OUT3 can output the voltage V3 of the third input terminal IN3 as the enable signal to post circuits or devices. The voltage V3 is the voltage that is divided by the voltage divided resistors R5 and R6 from the second input terminal voltage (VB).

When the first input terminal voltage (VA) is higher than the second setting voltage (VH) (that is, the voltage V2 is higher than the second reference voltage (Vref2)), the second detection controller 104 disconnects the second output terminal OUT2 from the ground, and the voltage across resistor R6 cannot bias the gate and the source of the PMOS transistor, so that the PMOS transistor is turned off, and thus the third output terminal OUT3 cannot output the voltage V3 of the third input terminal IN3 as the enable signal.

Figure 3:
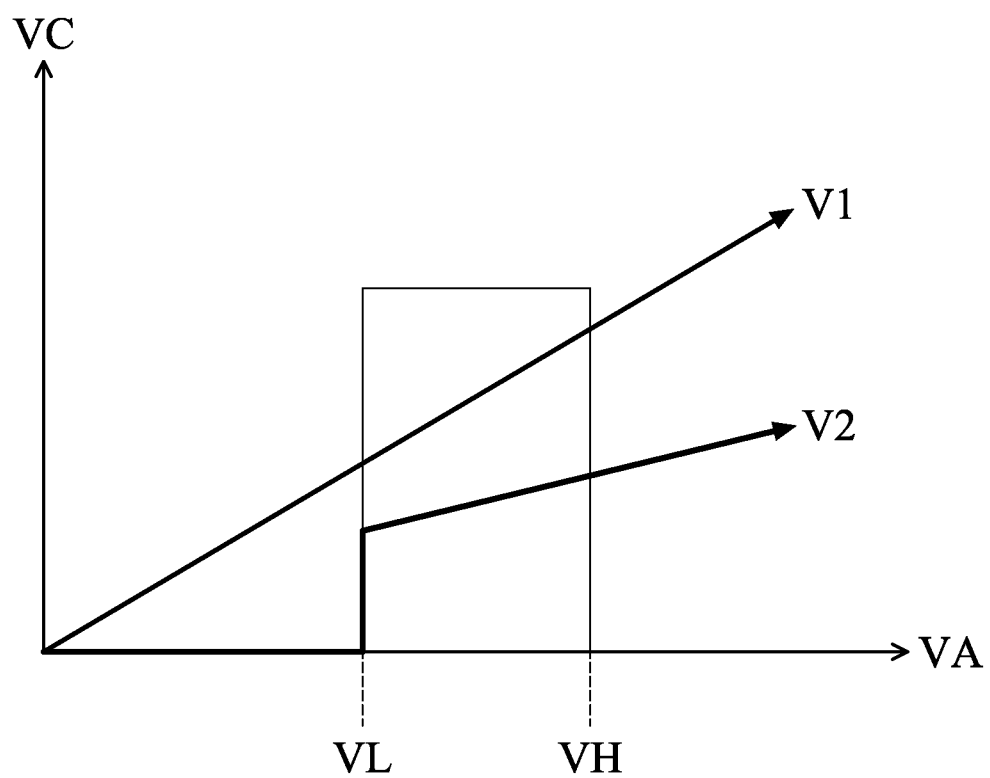
FIG. 3 shows a relation chart between the voltage of a third output terminal, a first input terminal voltage, and a second input terminal voltage in FIG. 1 in accordance with the embodiment of the disclosure.

FIG. 3 shows a relation chart between a voltage (VC) of a third output terminal OUT3, a first input terminal voltage (VA), and a second input terminal voltage (VB) in FIG. 1 in accordance with the embodiment of the disclosure. In some embodiments, according to the schematic in FIG. 1, the first input terminal voltage is denoted as VA, the second input terminal voltage is denoted as VB, and based on the voltage divider rule, the relationship between the voltage V1 and V2 and the voltage divided resistors (R1-R4) is as follows:

$$V1=VA*R2/(R1+R2)$$

$$V2=VA*R4/(R3+R4)$$

When the second detection controller 104 connects the second output terminal OUT2 to the ground, the relationship between the voltage V3 and the voltage divided resistors (R5-R6) is as follows, $$V3=VB*R6/(R5+R6)$$

The relationship between the first setting voltage (VL) of the first detection controller 102, the second setting voltage (VH) of the second detection controller 104, the first reference voltage Vref1, and the second reference voltage Vref2 is as follows:

$$VL=Vref1*(1+R1/R2)$$

$$VH=Vref2*(1+R3/R4)$$

Therefore, by adjusting or setting the first and second reference voltage (Vref1 and Vref2) in the first detection controller 102 and the second detection controller 104, and/or adjusting or setting the resistance of the voltage divided resistors (R1-R4), the first setting voltage (VL) and the second setting voltage (VH) can be set. Thus, the enable circuit 100 disclosed in the present invention can output the enable signal when the first input terminal voltage (VA) is higher than the first setting voltage (VL) but lower than the second setting voltage (VH). Thus, the enable circuit 100 disclosed in the present invention is a voltage band-pass enable circuit: That is, the enable signal is output only when the first input terminal voltage (VA) is higher than the first setting voltage (VL) but lower than the second setting voltage (VH).

As shown in FIG. 3, when a circuit device or system where the enable circuit 100 is located boots up, due to a gradual increase from 0V of the first input terminal voltage (VA) that is provided by an input power (not shown in FIG. 1), the voltage V1 is proportionally increased in accordance with the equation above. When the voltage V1 is not higher than the first reference voltage (Vref1) (that is, the first input terminal voltage (VA) is not higher than the first setting voltage (VL)), the first detection controller 102 connects the first output terminal OUT1 to the ground, so that the voltage of the first output terminal OUT1 of the first detection controller 102 is 0V, and the voltage V2 is also 0V. When the voltage V1 is higher than the first reference voltage (Vref1) (that is, the first input terminal voltage (VA) is higher than the first setting voltage (VL)), the first detection controller 102 disconnects the first output terminal OUT1 from the ground, so that the voltage of the first output terminal OUT1 becomes VA*R4/(R3+R4). After that, the voltage V2 is also proportionally increased as follows by the first input terminal voltage (VA). When the voltage V2 of the second input terminal IN2 is not higher than the second reference voltage (Vref2) (that is, the first input terminal voltage (VA) is not higher than the second setting voltage (VH)), the second detection controller 104 connects the second output terminal OUT2 to the ground, so that the enable switch 106 is turned on and the voltage V3 outputs from the third output terminal OUT3 to provide the enable signal to post circuits or devices. When the voltage V2 of the second input terminal IN2 is higher than the second reference voltage (Vref2) (that is, the first input terminal voltage (VA) is higher than the second setting voltage (VH)), the second detection controller 104 disconnects the second output terminal OUT2 from the ground, so that the enable switch 106 is turned off and the voltage of the third output terminal OUT3 of the enable switch 106 becomes 0V, and thus the enable switch 106 stops outputting the enable signal. It should be noted that in some embodiments, the second input terminal voltage VB is the voltage that is directly provided by a second input terminal power or provided by the second input terminal power after regulation. Therefore, after the aforementioned devices or systems boot up, when the first input terminal voltage (VA) is increased to higher than the first setting voltage (VL) but lower than the second setting voltage (VH), the second input terminal voltage can be increasing continuously or be stable. According to the embodiments disclosed herein, the second input terminal voltage (VB) is stable when the first input terminal voltage (VA) is higher than the first setting voltage (VL) but lower than the second setting voltage (VH), so that the voltage VC of the enable signal that is output from the enable circuit 100 in FIG. 2 is stable.

Figure 4:
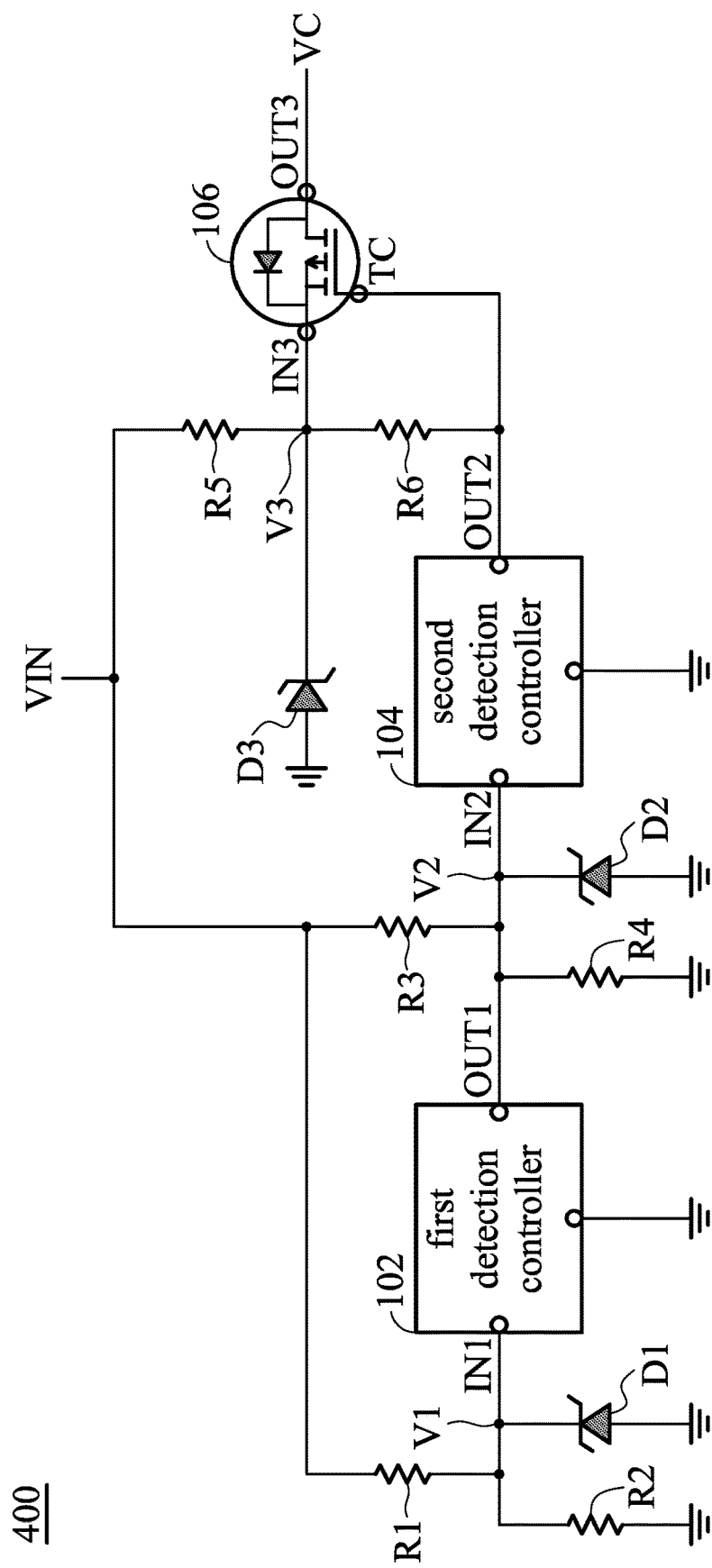
FIG. 4 shows a schematic of an enable circuit in accordance with another embodiment of the disclosure.
Figure 5:
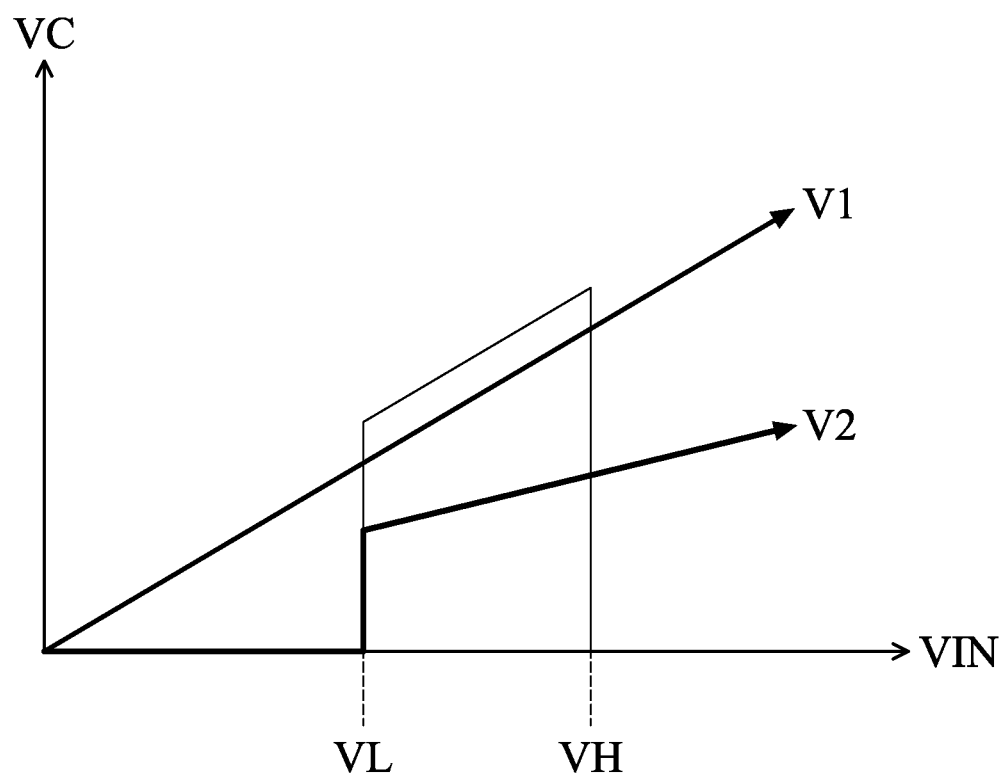
FIG. 5 shows a relation chart between a voltage of a third output terminal and voltage VIN in FIG. 4 in accordance with the embodiment of the disclosure.

FIG. 4 shows a schematic of an enable circuit 400 in accordance with another embodiment of the disclosure. The difference between the enable circuit of FIG. 4 and that of FIG. 1 is that a node of the first input terminal voltage is connected to a node of the second input terminal voltage, so that the first input terminal voltage (VA) and the second input terminal voltage (VB) of the enable circuit 100 in FIG. 1 can correspond to the input voltage VIN of the enable circuit 400 in FIG. 4. Except for the aforementioned difference, the operation of the enable circuit 400 is the same as that of the enable circuit 100, and the description thereof will not be repeated herein. FIG. 5 shows a relation chart between the voltage of the third output terminal (VC) and the voltage VIN in FIG. 4 in accordance with an embodiment of the disclosure. As shown in FIG. 5, due to the connection between the nodes of the first input terminal voltage (VA) and the second input terminal voltage (VB), when the voltage VIN is higher than the first setting voltage (VL) but lower than the second setting voltage (VH), the voltage VC of the third output terminal OUT3 is also proportionally increased as follows by the voltage VIN, so that there is an obvious difference between the voltage VC of the third output terminal OUT3 in FIG. 5 and that in FIG. 3.

Zener diodes (D1-D3) in FIG. 1 and FIG. 4 can clamp the voltage (V1-V3) to protect the first detection controller 102 and the second detection controller 104 from over-voltage rating damage.

Figure 6:
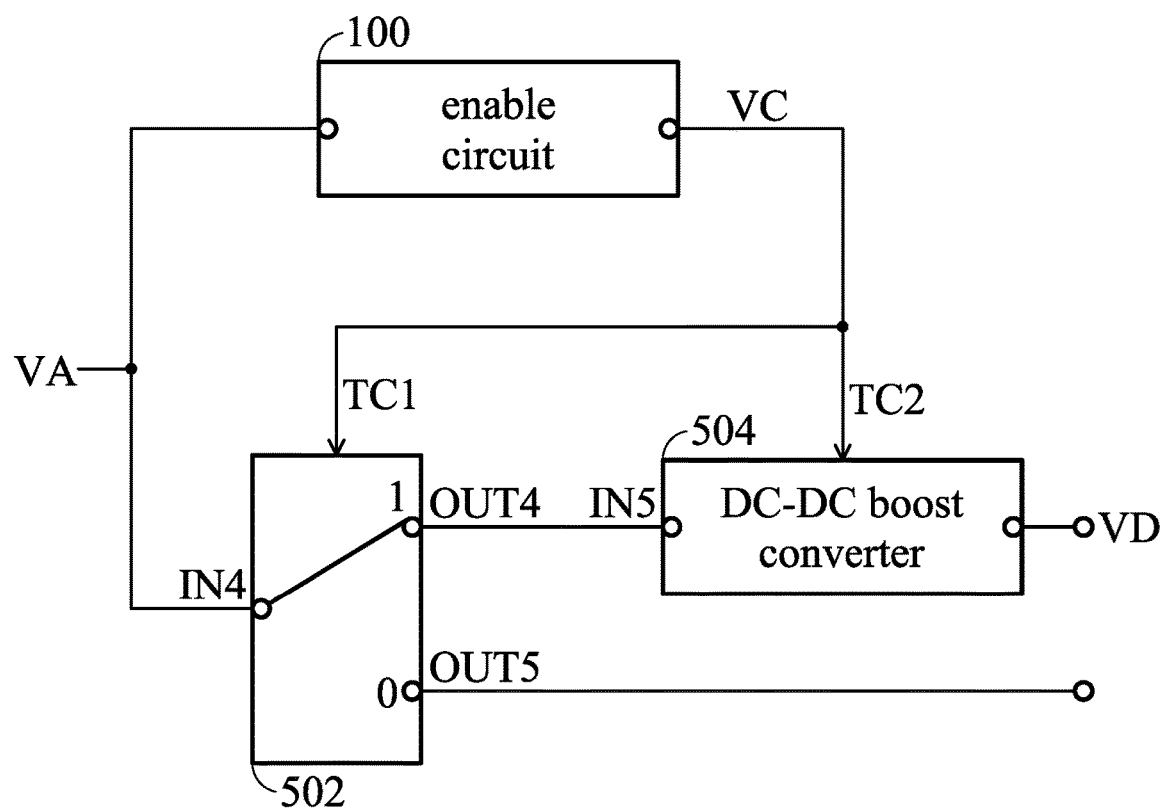
FIG. 6 shows a block diagram of a power switching system where the enable circuit in FIG. 1 is applied in accordance with the embodiment of the disclosure.

FIG. 6 shows a block diagram of a power switching system where the enable circuit 100 in FIG. 1 is applied in accordance with the embodiment of the disclosure. As shown in FIG. 6, the power switching system 500 comprises an enable circuit 100, a two-way switch 502, and a DC-DC boost converter 504. As shown in FIG. 1, the enable circuit 100 receives the first input terminal voltage (VA), and when the first input terminal voltage (VA) is higher than the first setting voltage (VL) but lower than the second setting voltage (VH), the enable circuit 100 outputs an enable signal (that is, the voltage VC output from the third output terminal OUT3 in FIG. 1). The two-way switch 502 has a fourth input terminal IN4 that receives the first input terminal voltage (VA), a fourth output terminal OUT4, a fifth output terminal OUT5, and a first control terminal that receives the enable signal from the enable circuit 100. When the enable signal is at logic high level, the two-way switch 502 connects the fourth input terminal IN4 to the fourth output terminal OUT4. When the enable signal is at logic low level, the two-way switch 502 connects the fourth input terminal IN4 to the fifth output terminal OUT5. It should be noted that the default status of the two-way switch 502 after operation is to connect the fourth input terminal IN4 to the fifth output terminal OUT5. Accordingly, if there is no enable signal received from the control terminal TC1 of the two-way switch 502, the two-way switch 502 connects the fourth input terminal IN4 to the fifth output terminal OUT5, so that the first input terminal voltage (VA) is coupled to the fifth output terminal OUT5 of the two-way switch 502.

DC-DC boost converter 504 has a fifth input terminal IN5 that connects to the fourth output terminal OUT4 of the two-way switch 502, and a second control terminal TC2 that receives the enable signal. When the enable signal is at logic high level, the DC-DC boost converter 504 is enabled to boost the first input terminal voltage (VA) to a specific voltage (VD) via the two-way switch 502, wherein the specific voltage (VD) is higher than the first input terminal voltage (VA). When the enable signal is at logic low level, the DC-DC boost converter 504 is then disabled.

The enable circuit disclosed in the present invention can be applied on electronic devices with multiple inputs from different power sources. For example, a removable display laptop includes a base board and a removable display. In general, the operation voltage of the base board is 5V, but the operation voltage of the removable display is 12V. Thus a DC-DC boost converter (such as element 504 in FIG. 5) is required in the base board to boost the voltage from 5V to 12V for the use of the removable display. When the removable display laptop connects to external power for charging, the voltage of the external power is 20V, so that at this time, the DC-DC boost converter 504 can be disabled, and the removable display can be directly powered by the external power after stepping down to its operation voltage. Therefore, the enable circuit 100 disclosed in the present invention can be applied by setting the first setting voltage (VL) to 5V and the second setting voltage (VH) to 12V. When the removable display laptop is powered by external power (20V), because 20V of the input voltage of the external power is higher than the 12V of the second setting voltage, the enable circuit 100 then disables the DC-DC boost converter 504 to save power and improve system stability.

The ordinal in the specification and the claims of the present invention, such as "first", "second", "third", etc., has no sequential relationship, and is just for distinguishing between two different components with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. An enable circuit, comprising:
    a first detection controller, with a first input terminal coupled to a first input terminal voltage and a first output terminal, wherein when the first input terminal voltage is not higher than a first setting voltage, the first detection controller connects the first output terminal to a ground; when the first input terminal voltage is higher than the first setting voltage, the first detection controller disconnects the first output terminal from the ground;
    a second detection controller, with a second input terminal coupled to the first input terminal voltage and a second output terminal, wherein the second input terminal is further coupled to the first output terminal, and when the first input terminal voltage is not higher than a second setting voltage, the second detection controller connects the second output terminal to the ground; when the first input terminal voltage is higher than the second setting voltage, the second detection controller disconnects the second output terminal from the ground; wherein the second setting voltage is higher than the first setting voltage; and
    an enable switch, with a control terminal coupled to the second output terminal, a third input terminal coupled to a second input terminal voltage, and a third output terminal;
    wherein when the first input terminal voltage is higher than the first setting voltage but lower than the second setting voltage, the enable circuit is coupled to the ground by the second output terminal, so that the enable switch is turned on to output from the third output terminal an enable signal, which is provided by the second input terminal voltage.

2. The enable circuit as claimed in claim 1, wherein the first input terminal voltage is provided by a first input terminal power; after the first input terminal power starts up, when the first input terminal voltage is increased from the first setting voltage to the second setting voltage, the enable circuit outputs the enable signal.

3. The enable circuit as claimed in claim 1, further comprising one or more voltage clamping devices, coupled to the first input terminal of the first detection controller, the second input terminal of the second detection controller, or between the third input terminal of the enable switch and the ground, to clamp the first input terminal voltage or the second input terminal voltage under a rating voltage of the first detection controller or the second detection controller.

4. A power switching system, comprising:
    the enable circuit of claim 1, receiving the first input terminal voltage, and when the first input terminal voltage is higher than the first setting voltage but lower than the second setting voltage, outputting the enable signal from the third output terminal;
    a two-way switch, with an input terminal, an output control terminal, a fourth output terminal, and a fifth output terminal; wherein the input terminal receives the first input terminal voltage, and the output control terminal couples to the third output terminal of the enable circuit; the two-way switch connects the input terminal to the fourth output terminal when receiving the enable signal, but otherwise connects the input to the fifth output terminal;
    a DC-DC boost converter, couples to the fourth output terminal of the two-way switch, and boosts the first input terminal voltage output from the fourth input terminal when receiving the enable signal.

* * * * *